(12) United States Patent
Biberger et al.

(10) Patent No.: US 8,759,796 B2
(45) Date of Patent: Jun. 24, 2014

(54) PARTICLE BEAM SYSTEM

(75) Inventors: Josef Biberger, Wildenberg (DE); Ralph Pulwey, Aalen (DE)

(73) Assignee: Carl Zeiss Microscopy GmbH, Jena (DE)

( * ) Notice: Subject to any disclaimer, the term of this patent is extended or adjusted under 35 U.S.C. 154(b) by 542 days.

(21) Appl. No.: 13/025,556

(22) Filed: Feb. 11, 2011

(65) Prior Publication Data
US 2012/0025093 A1 Feb. 2, 2012

(30) Foreign Application Priority Data

Feb. 12, 2010 (DE) .......................... 10 2010 007 777

(51) Int. Cl.
*G21K 1/00* (2006.01)
*H01J 37/317* (2006.01)
*H01J 37/26* (2006.01)
*H01J 37/04* (2006.01)

(52) U.S. Cl.
CPC ............. *H01J 37/3174* (2013.01); *H01J 37/26* (2013.01); *H01J 37/045* (2013.01); *H01J 2237/317* (2013.01)
USPC ............. 250/492.1; 250/396 R; 250/396 ML; 250/492.3

(58) Field of Classification Search
None
See application file for complete search history.

(56) References Cited

U.S. PATENT DOCUMENTS

| | | | | |
|---|---|---|---|---|
| 3,925,660 A | * | 12/1975 | Albert | 378/45 |
| 3,983,397 A | * | 9/1976 | Albert | 378/45 |
| 4,007,375 A | * | 2/1977 | Albert | 378/113 |
| 4,063,091 A | | 12/1977 | Gee | |
| 4,710,640 A | | 12/1987 | Kawasaki | |
| 6,278,124 B1 | * | 8/2001 | Penberth et al. | 250/492.22 |
| 2007/0138413 A1 | * | 6/2007 | Abe et al. | 250/492.22 |
| 2009/0026912 A1 | | 1/2009 | Lordi et al. | |
| 2010/0200750 A1 | * | 8/2010 | Mantz et al. | 250/310 |

FOREIGN PATENT DOCUMENTS

| | | |
|---|---|---|
| WO | 2005119361 A2 | 12/2005 |
| WO | 2007041057 A2 | 4/2007 |

OTHER PUBLICATIONS

Office Action in German patent application No. 10 2010 007 777.1 dated Sep. 23, 2010 (4 pages, plus 4 pages of English-language translation).
E. Plies, "Electron-Optical Components for E-Beam Testing", Microelectronic Engineering 12, 1990, pp. 189-204.

* cited by examiner

*Primary Examiner* — Andrew Smyth
(74) *Attorney, Agent, or Firm* — Bruce D Riter

(57) ABSTRACT

A particle beam system includes a particle beam source for generating a particle beam, a high voltage source, a beam blanker system with deflection plates 56, 57, and a control circuit. The control circuit provides a first current path 67 between the two deflection plates, wherein a switch 70, a node 72 connected to the high voltage source and a switch 76 are arranged in this order in the first current path starting from the deflection plate 56. The control circuit provides a second current path 85 between the deflection plate 56 and the deflection plate 57, wherein in the second current path, starting from the deflection plate 56, a series connection 88 comprising a voltage source 91 a switch 90, a node 86 connected to the high voltage source and a series connection 92 comprising a voltage source 95 and a switch 94 are arranged in this order.

16 Claims, 3 Drawing Sheets

PARTICLE BEAM SYSTEM

CROSS-REFERENCES TO RELATED APPLICATIONS

The present application claims priority of Patent Application No. 10 2010 007 777.1, filed Feb. 12, 2010 in Germany, entitled "Particle Beam System", the content of which is hereby incorporated by reference in its entirety.

FIELD OF THE INVENTION

The invention relates to a particle beam system including an electrostatic beam blanker system.

BACKGROUND OF THE INVENTION

A conventional particle beam system includes a particle beam source for generating a particle beam, and a high voltage source for providing an acceleration voltage, in order to accelerate the charged particles of the particle beam that are generated by the particle beam source to a desired kinetic energy. The conventional system further comprises a pair of deflection plates, between which a beam path of the particle beam extends. The first deflection plate of the pair can be connected to a high voltage source, and the second deflection plate of the pair can be selectively connected, via a switch, to this high voltage source or to another voltage source providing an electric potential different from that of the high voltage source. If this second deflection plate is connected to the high voltage source, the particle beam is substantially not affected when traversing the pair of deflection plates and propagates essentially along a straight line. If the second deflection plate is connected to the other voltage source however, an electric field is produced between the two deflection plates. Such electric field deflects the particle beam, so that it is, for example, incident on a plate downstream of the deflection plates and is absorbed by such plate. Depending on a switching state of the switch, the particle beam is selectively available downstream of the plate and can therefore be switched on and off by operating the switch.

It has been found that immediately after the beam has been switched on, the conventional particle beam system does not provide desired operating characteristics and that the desired operating characteristics are achieved only after a fairly long period of time.

SUMMARY OF THE INVENTION

The present invention has been accomplished taking the above problems into consideration.

It is an object of the present invention is to provide a particle beam system which provides desired operating characteristics more quickly after changing a state of a beam blanker.

According to embodiments, a particle beam system comprises a particle beam source for generating a particle beam; a high voltage source; a beam blanker system with at least one pair of deflection plates, between which a beam path of the particle beam extends, and a control circuit, wherein the control circuit provides a first current path between a first deflection plate of the pair and a second deflection plate of the pair, wherein a first node connected to the high voltage source and a second switch are arranged in this order in the first current path starting from the first deflection plate.

The particle beam can be a beam of positively charged particles, such as, for example, ions, or negatively charged particles, such as, for example, ions or electrons. The high voltage source which supplies a voltage of more than 5 kV, for example. The switches are each configured to selectively allow or interrupt a flow of current between two terminals. The switches may comprise semiconductor switching elements, such as, for example, transistors and MOSFETs. The current paths are provided by electric conductors and electric components, such as resistors and switches which allow a current flow across the path in their closed state and which prevent the current flow across the path in their open state.

The pair of deflection plates form a capacitor, which is inserted into the first current path. When different voltages are applied to the two deflection plates, in order to deflect the particle beam passing between the two deflection plates, or to switch the beam off in a beam path downstream of the beam blanker system, the capacitor is charged up. In order to switch on the beam, the capacitor must be discharged, so that the two deflection plates are at the same electric potential.

The control circuit is configured to be symmetric in the sense that in order to discharge the capacitor two switches are closed, one of which is arranged in the discharge current path between the one deflection plate and the node connected to the high voltage source and the other is arranged between the other deflection plate and the node connected to the high voltage source. When switching the two switches from their open states with the capacitor charged to their closed state to discharge the capacitor, a potential of the node connected to the high voltage source is therefore not changed and the capacitor can discharge by a current flow within the first current path, without substantially varying the potential of the node connected to the first voltage source. The discharging of the capacitor has no substantial effect on the high voltage source, which may then provide a predetermined voltage at a constant value. Specifically, the predetermined voltage is then available immediately after discharging of the capacitor and consequently immediately after switching on the particle beam using the beam blanker system, so that the particle beam system also shows its desired properties immediately after the beam is switched on.

The inventors have recognized that in the conventional particle beam system the activation of the switch and the subsequent discharging of the capacitor formed by the deflection plates of the beam blanker system results in a change in the voltage provided by the high voltage source, such that the provided high is not sufficiently stable. Due to a voltage control of the high voltage source this change can only be compensated for only after some time period. During this time period, the particle beam system does not provide its desired properties.

Due to the symmetrical configuration of the first current path for discharging the capacitor formed by the two deflection plates, any effect on the high voltage source by the discharge process can be avoided.

According to embodiments of the particle beam system, a second current path for charging the capacitor formed by the two deflection plates is configured to be symmetric. For this purpose, the control circuit comprises a second current path between the first deflection plate and the second deflection plate, wherein a first series connection of a first voltage source and a third switch, a second node connected to the high voltage source, and a second series connection of a second voltage source and a fourth switch are arranged in the second current path in this order, starting from the first deflection plate.

The first and second voltage sources can each be provided by, for example, a battery or another voltage source circuit.

According to embodiments of the invention, resistors are arranged in the first current path symmetrically with respect to the pair of deflection plates and to the node connected to the high voltage source and in series with the first or second switch, respectively. These resistors have a function of dissipating the electric energy stored in the capacitor when it is charged. Resistances of these resistors can be dimensioned to allow the fastest possible discharging of the capacitor. For this purpose, the resistances should not be too small, since an oscillating current flow might then arise between the two deflection plates, and they should not be chosen to be too large, as the discharging of the capacitor might then take too long. Ideally, the resistances are dimensioned such that an oscillating circuit formed by the capacitance of the capacitor, an internal resistances of the first and the second switches in their closed states and an inductance of the conductors used to implement the first current path is critically damped in order to allow a fastest possible discharging of the capacitor. This results in the particle beam can being switched on very rapidly.

Similarly, the second current path may comprise a pair of resistors, in order to allow rapid charging of the capacitor to switch off the beam. Resistances of the third and fourth resistors in this arrangement may again be dimensioned such that a corresponding oscillating circuit formed by the capacitance of capacitor, internal resistances of the third and the fourth switches in their closed states, internal resistances of the first and second current sources and inductances of the conductors used to implement the second current path is critically damped.

According to embodiments of the particle beam system, the high voltage source supplies potentials of more than 5 kV, in particular more than 7 kV and further, more than 10 kV. These potentials can be measured for example with respect to a ground potential of the particle beam system, or to a cathode of the particle beam source.

According to embodiments of the particle beam system, voltages that are provided by the second and/or the third voltage sources have values of more than 10 V, more than 50 V or more than 150 V.

BRIEF DESCRIPTION OF THE DRAWINGS

The forgoing as well as other advantageous features of the invention will be more apparent from the following detailed description of exemplary embodiments of the invention with reference to the accompanying drawings. It is noted that not all possible embodiments of the present invention necessarily exhibit each and every, or any, of the advantages identified herein.

DETAILED DESCRIPTION OF EXEMPLARY EMBODIMENTS

Figure 1:
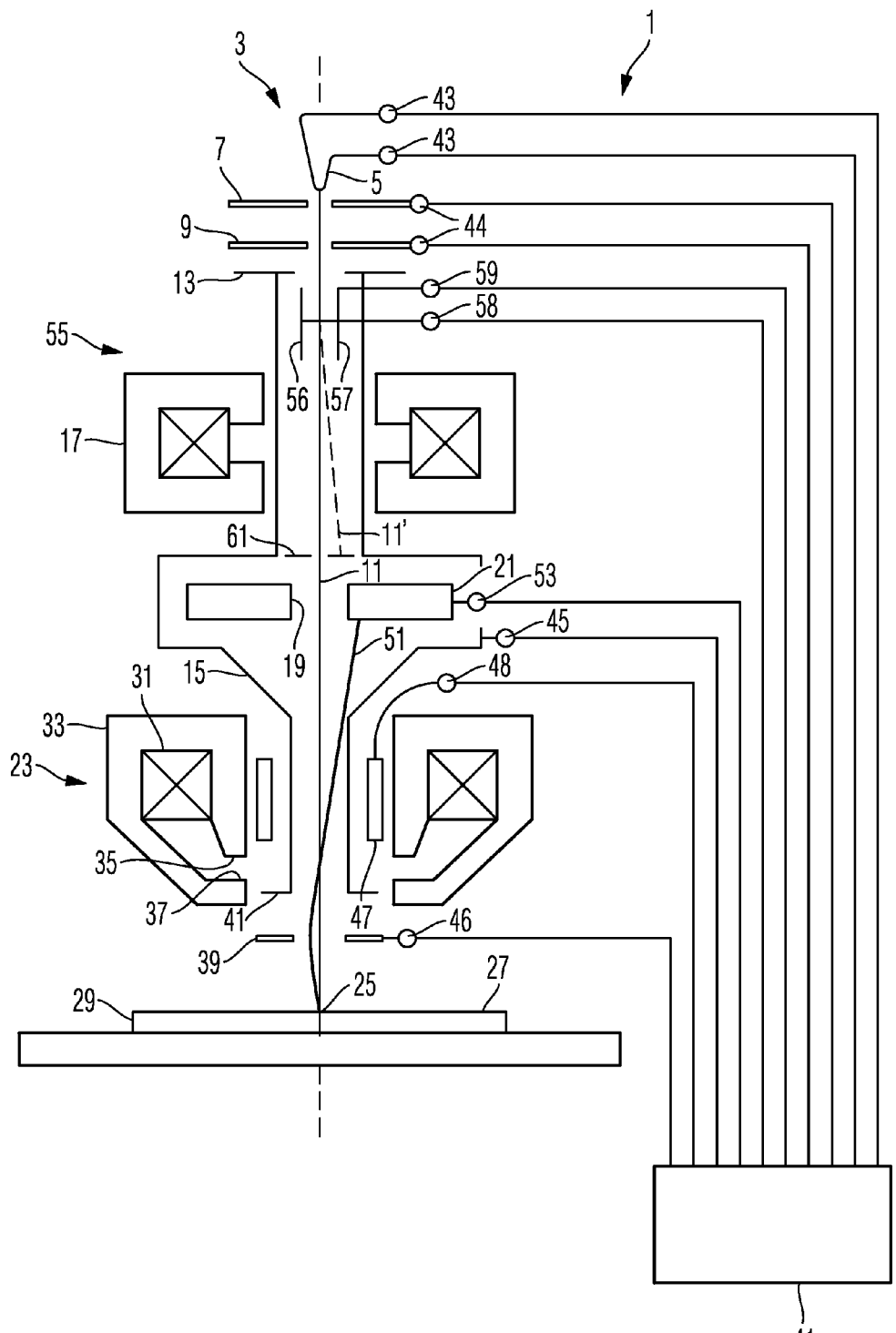
FIG. 1 is a schematic illustration of a particle beam system according to an embodiment.

In the exemplary embodiments described below, components that are alike in function and structure are designated as far as possible by alike reference numerals. Therefore, to understand the features of the individual components of a specific embodiment, the descriptions of other embodiments and of the summary of the invention should be referred to.

FIG. 1 is a schematic illustration of an embodiment of a particle beam system. The particle beam system 1 comprises a particle beam source 3 including a cathode 5, a suppressor electrode 7 and an extractor electrode 9 for generating an electron beam 11. The electron beam 11 emerging from an opening in the extractor electrode 9 is accelerated by an anode 13 to a predetermined kinetic energy and enters a beam tube 15 via an opening in the anode 13.

The electron beam may traverse a condenser lens 17, an aperture 19 provided in an electron detector 21. The electron beam further traverses an objective lens 23 for focusing the electron beam 11 at a location 25 in an object plane 27 of the objective lens 23. A surface of an object which is to be inspected or manipulated with the particle beam system 1 can be arranged in the object plane 27. The objective lens 23 comprises an annular coil 31, which is arranged in an annular pole piece 33, which comprises an annular upper pole piece 35 and an annular lower pole piece 37 such that a magnetic field focusing the electron beam 11 is generated in an annular gap between the two pole pieces 35 and 37. The objective lens further comprises a terminal electrode 39 which is arranged spaced apart from a lower end 41 of the beam tube 15 and has an opening traversed by the electron beam 11. An electric field generated between the lower end of the beam tube 41 and the terminal electrode 39 decelerates the electrons, propagating inside the beam tube 15 at a high kinetic energy, to a desired lower kinetic energy at which they are incident on the object 29. This electric field may provide an additional focusing effect together with the magnetic field.

The individual components of the particle beam system 1 are controlled by a controller 41. The controller is shown in FIG. 1 as a functional block and comprises plural control components which can be spatially separated from each other or arranged together in, for example, a housing.

One component of the controller 41 controls the beam source via connectors 43 for supplying a heating current to the cathode 5 and defining a potential of the cathode. Potentials of the suppressor electrode 7 and the extractor electrode 9 are controlled via connectors 44. An electric potential of the beam tube 15 and the anode 13 is defined by the controller via a connector 45. For this purpose, the controller 41 comprises a stabilized high voltage source, which supplies a voltage of, for example, 8 kV with respect to ground to the connector 45. A potential of the cathode 5 can be set between, for example, 0 and −10 kV. The controller 41 may furthermore apply a fixed or adjustable potential of, for example, 0 to 5 kV via a connector 46 to the terminal electrode 39, and the object 29 can be at ground potential or at a potential different from ground potential.

Beam deflectors 47 which are controlled by the controller 41 via connectors 48 can be arranged in the objective lens 23. The beam deflectors can be magnetic beam deflectors which may provide adjustable deflecting magnetic fields within the beam tube 15 in order to vary the location 25 at which the electron beam 11 is incident on the object 29, and to scan the particle beam 11 across a portion of the surface 27 of the object 29.

The particle beam 11 incident on the object 29 causes secondary electrons or backscattered electrons to emanate from the object 29. A portion of these electrons may enter the beam tube 15 and can be detected by the electron detector 21.

An exemplary trajectory of a secondary electron incident on the electron detector 21 is labeled with reference numeral in FIG. 1. Detection signals triggered by incident electrons are output by the electron detector 21 at a connector 53 and read in by the controller 41.

The particle beam source 3 is preferably operated in a stationary mode, i.e. once it is put into operation, the particle beam source 3 is operated for several hours or even days under constant conditions such that the electron beam 11 is continuously generated. However, it is desirable to not allow the electron beam 11 to be constantly incident on the object 29 and to be able to switch the beam on off as required. For this purpose the particle beam system 1 comprises a beam blanker system 55 which comprises a pair of deflector electrodes 56, 57 which can be arranged inside the beam tube 15 such that the electron beam 11 traverses a gap formed between the deflector electrodes 56, 57. The controller 41 comprises a component including a control circuit described in detail below, which supplies electric potentials to the deflector electrodes 56, 57 via connectors 58 and 59.

If both deflector electrodes 56, 57 are at the same electric potential, the beam 11 traverses the gap between the deflector electrodes along a straight line. Preferably, the deflector electrodes are at a same electric potential as the beam tube 15.

If the deflector electrodes 56, 57 are at different electric potentials, an electrostatic field is produced between the two deflector electrodes. This electric field deflects the electron beam 11 away from its original trajectory. The deflected electron beam is shown in FIG. 1 as a broken line 11' and is incident on a plate 61 arranged in the beam tube 15. The plate 61 has an aperture which is traversed by the non-deflected beam 11 to be incident on the surface 27 of the object 29. The electron beam 11' incident on the plate 61 is absorbed and cannot reach the surface 27 of the object 29.

It is therefore possible during the continuous operation of the particle beam source 3 to operate the particle beam system 1 in a first operating mode in which a same potential is applied by the controller 41 to the connectors 58, 59 and in which the particle beam is switched on at the location of the object 29, and to operate the particle beam system 1 in a second operating mode in which different electric potentials are applied by the controller 41 to the terminals 58, 59 in order to switch the particle beam off at the object 29.

The component of the controller 41 providing a control circuit 63, which is part of the beam blanker system 55, will be illustrated below with the reference to FIG. 2.

Figure 2:
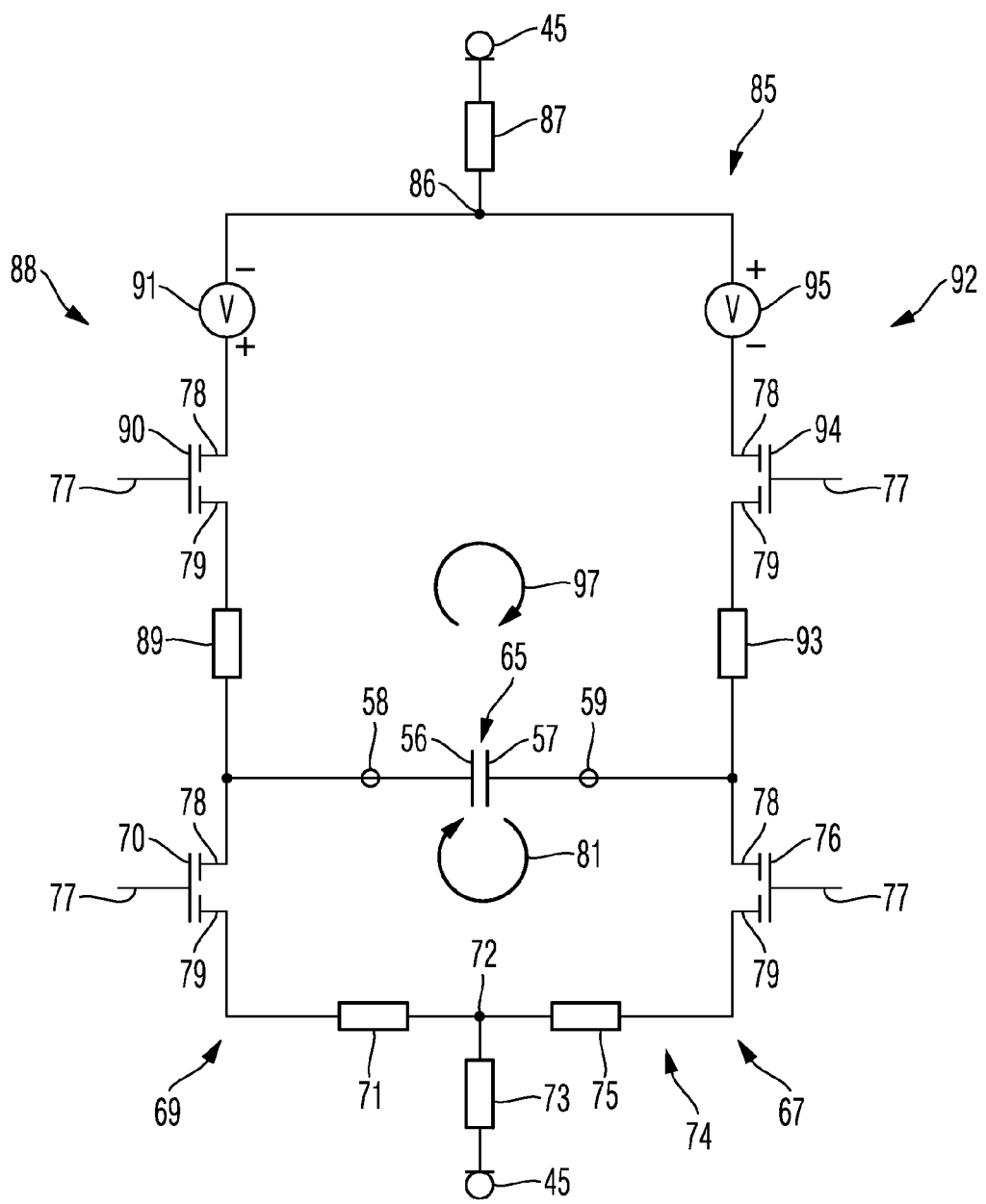
FIG. 2 is a schematic illustration of a detail of a control circuit of a beam blanker system of the particle beam system shown in FIG. 1.

The two deflection plates 56, 57 form, from an electric point of view, a capacitor 65, which is shown as such in the circuit diagram of FIG. 2. The capacitor 65 is connected via the connectors 58 and 59 to the controller 41 which provides two current paths in which the capacitor 65 is arranged. A first current path 67 is used for discharging the capacitor 65. For this purpose, the following elements are connected in series between the connectors 58 and 59, and the deflection plates 56 and 57, respectively: a first series connection 69 of a switch 70 and a resistor 71, a node 72 connected via a resistor 73 to the terminal 45 connected to the beam tube 15, and a second series connection 74 of a resistor 75 and a switch 76. The individual elements of the series connections 69 and 74 can be arranged in any desired order. It is preferable, however, to choose the arrangement order of the individual elements in the respective series connections such that both of the series connections are symmetrically arranged.

In the illustrated embodiment, the switches 70 and 76 are in the embodied as MOSFETs and have a function of allowing or blocking a current flow between terminals 78 and 79 of the switch based on a voltage that is applied to a control terminal 77 of the switch 70, 76. The switches 70 and 76 can also be realized by other electric switching elements which are capable of allowing and blocking a current flow between two terminals 78 and 79, based on a signal, such as a voltage signal, applied to a control terminal 77.

By controlling the two switches 70 and 76 via their terminals 77 it is possible to set the switches to their closed state, such that the charged capacitor 65 can discharge. A corresponding current flow is shown in FIG. 2 by an arrow 81.

The current path 67 is symmetrically arranged with respect to the node 72 connected to the beam tube 15 and to the capacitor 65, in that the series connections 69 and 74 are arranged on both sides of both the node 72 and the capacitor 65. Due to this symmetric arrangement, closure of the switches 70 and 76 when the capacitor 65 is charged does not induce any current to flow from the node 72 via to the connector 45 the resistor 73, which current could affect a potential provided by the high voltage source at the connector 45. The high voltage potential supplied to the beam tube 15 remains substantially unchanged when the electron beam 11 is switched on. After the electron beam 11 has been switched on, it is available immediately available and stable as required, such that it can be used for its intended purposes, such as, for example, the inspection or modification of the object 29.

The control circuit provides a second current path 85 for charging of the capacitor 65. The second current path 85 is also symmetrically arranged with respect to the capacitor and a node 86 connected to the connector 45 via a resistor 87, wherein connector 45 is connected to the beam tube 15. On the left-hand side in FIG. 2, a series connection 88 is arranged between the connector 58 of the deflection plate 56 and the node 86, wherein the series connection 88 comprises a resistor 89, a switch 90 and a voltage source 91. On the right-hand side in FIG. 2, a series connection 92 is arranged between the connector 59 of the deflection plate 57 and the node 86, wherein the series connection 92 comprises a resistor 93, a switch 94 and a voltage source 95. The arrangement order of the individual elements 89, 90 and 91, or 93, 94 and 95 in the series connections 88 and 92 is again arbitrary, wherein it can be advantageous to select the arrangement order such that the series connections 88 and 92 have both a symmetric arrangement with respect to one another.

In the illustrated embodiment, the switches 90 and 94 are embodied as MOSFETs, but they can also be realized by other electric components which can allow or block a current flow between terminals 78 and 79 depending on a control signal applied to a control terminal 77.

The two series connections 88 and 92 each form a switchable voltage source which is switched on when the respective switch is closed and which is switched off when the respective switch is opened. The voltage sources 91 and 95 supply their output voltages continuously, wherein a magnitude of the output voltages can be adjustable.

The two voltage sources 91 and 95 each supply a voltage of, for example, 100 V and are oriented such that, when the switches 90 and 94 are closed (and switches 70 and 76 opened) a voltage corresponding to 200 V is applied between the deflection plates 56 and 57 in order to deflect the electron beam 11 and to direct it away from the object 29. A current flow in the second current path 85 for charging the capacitor 65 is indicated in FIG. 2 by an arrow 81. Due to the symmetric arrangement of the series connections 88 and 92, this current flow does not result in a current flowing to or from the second current path 85 from or to the high voltage source via the node 86, so that the high voltage applied to the beam tube 15 is not affected by switching off the electron beam. Using the illustrated control circuit, the electron beam 11 can be switched on and off rapidly without affecting the high voltage applied to the beam tube 15 and without affecting the electro-optical properties of the particle beam system 1, accordingly.

Figure 3:
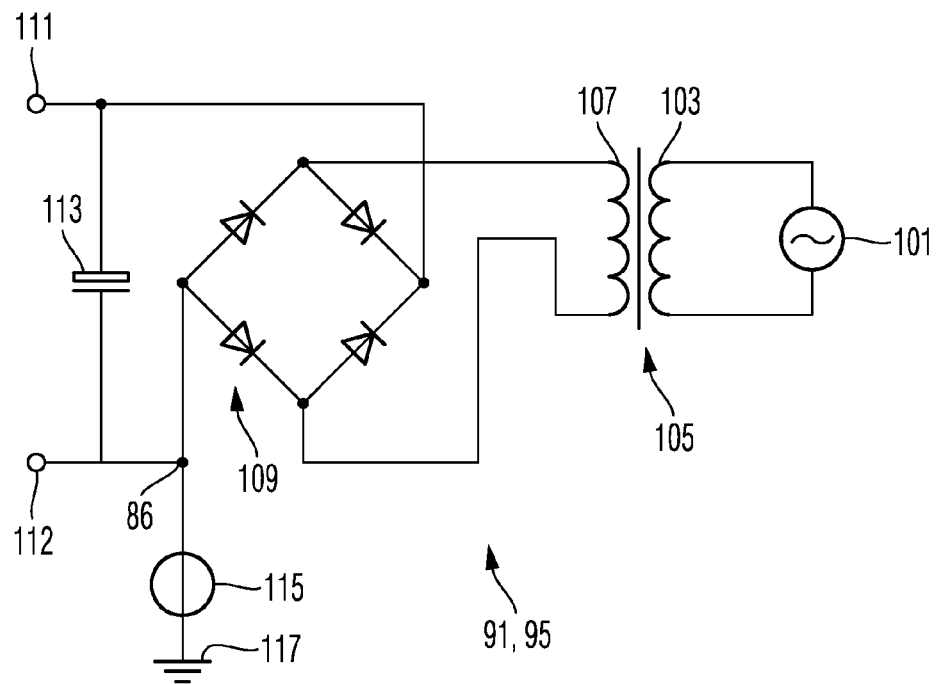
FIG. 3 is a schematic illustration of an embodiment of a voltage source.

FIG. 3 shows an exemplary embodiment of the voltage sources 91, 95 shown in FIG. 2. According to this embodiment, the voltage source 91, 95 comprises an AC voltage source 101 which is connected to an input winding 103 of a transformer 105 provided for potential separation. An output winding 107 of the transformer 105 is connected to a rectifier bridge circuit 109, which provides a DC voltage at outputs 111, 112 of voltage source 91, 95. The output voltage is smoothed by a capacitor 113. Due to the use of the transformer 105 it is possible for the AC voltage source 101 to be operated at a lower electric potential, while the rectifier bridge circuit 109 is operated at a high electric potential relative to a ground 117 provided by a high voltage source 115. The high voltage source 115 is connected to the node 86 which is connected to an output 112 of the voltage source 91, 95. The beam tube 15 is also connected to the node 86 in an electrically conducting manner.

The circuit shown in FIG. 3 continuously provides the voltage at its terminals 111, 112. Together with the switches, which are each connected to the voltage sources in series, two switchable voltage sources are formed. This is similarly possible, however, if a switch is inserted, for example, in the conductor between the AC voltage source 101 and the input winding 103. The circuit itself then already forms a switchable voltage source, which provides a switchable voltage at the terminals 111 and 112. In this case the series circuits 88 and 92 need not necessarily contain a switch (90 or 94 in FIG. 2) in order to provide a switchable voltage source.

Figure 4:
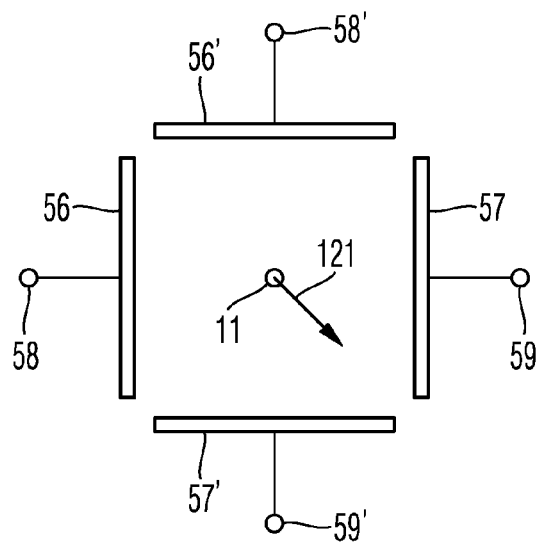
FIG. 4 is a schematic illustration of an embodiment of a beam deflector.

FIG. 4 illustrates a variation of an embodiment of a deflection system which according to the previous embodiments, comprises a pair of deflection plates. According to the variation shown in FIG. 4, a deflection system comprises two pairs of deflection plates, wherein one pair of deflection plates 56, 57 is oriented parallel to each other, wherein the other pair of deflection plates 56', 57' is also oriented parallel to each other, wherein the deflection plates 56 and 56' are oriented orthogonally to each other and wherein the deflection plates 57 and 57' are also oriented orthogonally to each other. The particle beam 11 traverses through a center of the deflection plates, wherein an electric potential is applied ton each deflection plate via terminals 58, 58', 59 and 59'. When for example, the terminals 58 and 58' are both connected to the control circuit and the terminals 59 and 59' are likewise both connected to the control circuit, it is possible to deflect the beam 11 at an angle downwards to the right as is indicated by an arrow 121 in FIG. 4. Likewise the terminals 58, 59 and the terminals 58', 59' can each be connected to different control circuits which provide individually adjustable control voltages, such that the direction 121 into which the beam 11 is deflected can then be adjusted by adjusting the individual voltages of the control circuits.

The embodiments described above relate to an electron microscope, in which the particle beam is an electron beam. According to further embodiments, the particle beam is an electron beam which is provided for modifying samples, by, for example, causing a removal of material from the sample or a deposition of material on the sample. According to further embodiments, the particle beam is an ion beam, which is provided in an ion beam system for inspection or modification of samples.

While the invention has been described with respect to certain exemplary embodiments thereof, it is evident that many alternatives, modifications and variations will be apparent to those skilled in the art. Accordingly, the exemplary embodiments of the invention set forth herein are intended to be illustrative and not limiting in any way.

Various changes may be made without departing from the spirit and scope of the present invention as defined in the following claims.

What is claimed is:

1. A particle beam system comprising:
a particle beam source configured to generate a particle beam;
a high voltage source; and
a beam blanker system comprising a pair of deflection plates and a control circuit;
wherein a beam path of the particle beam extends between a first deflection plate of the pair of deflection plates and a second deflection plate of the pair of deflection plates;
wherein the control circuit comprises a first switch, a second switch and a first node connected to an output terminal of the high voltage source;
wherein the control circuit provides a first current path between the first deflection plate and the second deflection plate;
wherein the first deflection plate, the first switch, the first node, the second switch and the second deflection plate are arranged in the first current path in this order;
wherein the control circuit further comprises a first switchable voltage source, a second switchable voltage source and a second node connected to the output terminal of the high voltage source;
wherein the control circuit further provides a second current path between the first deflection plate and the second deflection plate; and
wherein the first deflection plate, the first switchable voltage source, the second node, the second switchable voltage source and the second deflection plate are arranged in the second current path in this order.

2. The particle beam system according to claim 1, wherein the first switchable voltage source comprises a second voltage source and a third switch connected in series, and wherein the second switchable voltage source comprises a third voltage source and a fourth switch connected in series.

3. The particle beam system according to claim 2, wherein the first switchable voltage source further comprises a first resistor, wherein the second voltage source, the third switch and the first resistor are connected in series, wherein the second switchable voltage source further comprises a second resistor; and wherein the third voltage source, the fourth switch and the second resistor are connected in series.

4. The particle beam system according to claim 3, wherein the first resistor and the second resistor have equal resistances.

5. The particle beam system according to claim 1, wherein the first switchable voltage source and the second switchable voltage source each provide equal voltages in their switched on states.

6. The particle beam system according to claim 1, wherein the control circuit further comprises a third resistor and a fourth resistor, wherein the third resistor is arranged in the first current path between the first deflection plate and the first node, and wherein the fourth resistor is arranged in the first current path between the first node and the second deflection plate.

7. The particle beam system according to claim 6, wherein the third resistor and the fourth resistor have equal resistances.

8. The particle beam system according to claim 1, further comprising an aperture plate arranged in the beam path of the particle beam downstream of the pair of deflection plates, and wherein the aperture plate is configured and arranged to allow the particle beam to traverse the aperture plate in a first operating state of the particle beam system and to intercept the particle beam in a second operating state of the particle beam system.

9. The particle beam system according to claim 2, wherein the control circuit provides a first operating mode in which the first switch and the second switch are each in a state that closes the first current path and in which the third switch and the fourth switch are each in a state that interrupts the second current path; and wherein the control circuit provides a second operating mode in which the first switch and the second switch are each in a state that interrupts the first current path and in which the third switch and the fourth switch are each in a state that closes the second current path.

10. The particle beam system according to claim 9, further comprising an aperture plate arranged in the beam path of the particle beam downstream of the pair of deflection plates, wherein the particle beam system has a first operating state and a second operating state, wherein the aperture plate is configured and arranged to allow the particle beam to traverse the aperture plate in the first operating state of the particle beam system and to intercept the particle beam in the second operating state of the particle beam system, and wherein the particle beam system is configured to operate the control circuit in the first operating mode in the first operating state, and operate the control circuit in the second operating mode in the second operating state.

11. The particle beam system according to claim 1, further comprising an objective lens configured to focus the particle beam in a sample plane, wherein the objective lens is arranged in the beam path of the particle beam downstream of the pair of deflection plates.

12. The particle beam system according to claim 1, wherein the high voltage source is a high voltage source configured to supply a high voltage of more than 5 kV relative to ground potential.

13. The particle beam system according to claim 2, further comprising a beam tube connected to the first voltage source, wherein the beam path of the particle beam traverses the beam tube.

14. The particle beam system according to claim 2, wherein the particle beam source comprises a cathode and wherein a voltage difference between the cathode and the output terminal of the first voltage source is greater than 5 kV.

15. The particle beam system according to claim 2, wherein the second voltage source and the third voltage source are configured to produce voltages of more than 10 V.

16. The particle beam system according to claim 2, wherein the second voltage source and the third voltage source are configured to produce voltages of less than 4 kV.

\* \* \* \* \*

UNITED STATES PATENT AND TRADEMARK OFFICE
CERTIFICATE OF CORRECTION

PATENT NO. : 8,759,796 B2  
APPLICATION NO. : 13/025556  
DATED : June 24, 2014  
INVENTOR(S) : Josef Biberger et al.

Page 1 of 1

It is certified that error appears in the above-identified patent and that said Letters Patent is hereby corrected as shown below:

In the Specification, at:

Column 1, line 52, delete "invention is to" and replace with --invention to--

Column 2, line 46, delete "high" and replace with --high voltage-- line 47, delete "can only be" and replace with --can be--

Column 4, line 16, delete "object" and replace with --object 29-- line 67, delete "numeral" and replace with --numeral 51--

Column 5, line 44, delete "with the reference" and replace with --with reference--

Column 6, line 14, delete "via to the" and replace with --via the-- line 15, delete "45 the" and replace with --45 to the-- line 20, delete "is available immediately" and replace with --is immediately-- line 26, delete "capacitor" and replace with --capacitor 65--

Signed and Sealed this  
Seventeenth Day of February, 2015

Michelle K. Lee  
*Deputy Director of the United States Patent and Trademark Office*